United States Patent
Yoo et al.

(10) Patent No.: US 9,806,293 B2
(45) Date of Patent: Oct. 31, 2017

(54) ENCAPSULATION FILM

(71) Applicant: LG CHEM, LTD., Seoul (KR)

(72) Inventors: Hyun Jee Yoo, Daejeon (KR); Yoon Gyung Cho, Daejeon (KR); Suk Ky Chang, Daejeon (KR); Jung Sup Shim, Daejeon (KR); Seung Min Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/244,693

(22) Filed: Apr. 3, 2014

(65) Prior Publication Data
US 2014/0217621 A1 Aug. 7, 2014

Related U.S. Application Data

(63) Continuation of application No. PCT/KR2013/000109, filed on Jan. 7, 2013.

(30) Foreign Application Priority Data

Jan. 6, 2012 (KR) .................. 10-2012-0002170
Jan. 7, 2013 (KR) .................. 10-2013-0001832

(51) Int. Cl.
*H01L 23/29* (2006.01)
*H01L 51/52* (2006.01)
(Continued)

(52) U.S. Cl.
CPC ........... *H01L 51/5259* (2013.01); *B32B 3/04* (2013.01); *B32B 27/08* (2013.01); *B32B 27/18* (2013.01);
(Continued)

(58) Field of Classification Search
CPC ... H01L 23/293; H01L 21/56; H01L 51/5259; H01L 51/56; H01L 51/5253;
(Continued)

(56) References Cited

U.S. PATENT DOCUMENTS 4,636,578 A * 1/1987 Feinberg ..................... 136/251
4,682,850 A * 7/1987 White et al. ................. 385/109
(Continued)

FOREIGN PATENT DOCUMENTS

CN 1669362 A 9/2005
CN 101370889 A 2/2009
(Continued)

OTHER PUBLICATIONS

"Tensile Strength of Polypropylene". www.shimadzu.com/an/industry/petrochemicalchemical/i201.html. Retrieved Aug. 22, 2015.*
(Continued)

*Primary Examiner* — Phat X Cao
*Assistant Examiner* — Mohammad M Hoque
(74) *Attorney, Agent, or Firm* — Dentons US LLP

(57) ABSTRACT

The present application relates to an encapsulating film, an electronic device and a method of manufacturing the same. In the present application, an encapsulating film having excellent moisture blocking property, handleability, workability and durability and a structure including a diode encapsulated with the encapsulating film may be provided.

11 Claims, 3 Drawing Sheets

(51) Int. Cl.

| | |
|---|---|
| H01L 21/56 | (2006.01) |
| B32B 27/08 | (2006.01) |
| B32B 27/18 | (2006.01) |
| H05B 33/04 | (2006.01) |
| B32B 43/00 | (2006.01) |
| H01L 51/56 | (2006.01) |
| B32B 37/14 | (2006.01) |
| C09D 123/22 | (2006.01) |
| C09D 163/00 | (2006.01) |
| B32B 3/04 | (2006.01) |
| B32B 37/10 | (2006.01) |
| B32B 37/12 | (2006.01) |
| B32B 37/24 | (2006.01) |

(52) U.S. Cl.
CPC ............ *B32B 37/142* (2013.01); *B32B 43/00* (2013.01); *C09D 123/22* (2013.01); *C09D 163/00* (2013.01); *H01L 21/56* (2013.01); *H01L 23/293* (2013.01); *H01L 51/524* (2013.01); *H01L 51/5253* (2013.01); *H01L 51/56* (2013.01); *H05B 33/04* (2013.01); *B32B 37/10* (2013.01); *B32B 2037/1223* (2013.01); *B32B 2037/243* (2013.01); *B32B 2307/54* (2013.01); *B32B 2307/7265* (2013.01); *B32B 2309/02* (2013.01); *B32B 2309/04* (2013.01); *B32B 2309/10* (2013.01); *B32B 2309/105* (2013.01); *B32B 2310/0831* (2013.01); *B32B 2315/08* (2013.01); *B32B 2457/00* (2013.01); *B32B 2457/20* (2013.01); *B32B 2457/206* (2013.01); *H01L 2924/0002* (2013.01); *Y10T 156/10* (2015.01); *Y10T 428/24942* (2015.01); *Y10T 428/31511* (2015.04); *Y10T 428/31931* (2015.04); *Y10T 428/31938* (2015.04)

(58) Field of Classification Search
CPC ... H01L 51/524; C09D 123/22; C09D 163/00; B32B 37/142; B32B 43/00; B32B 27/18; B32B 3/04; H05B 33/04
USPC .......................................................... 257/788
See application file for complete search history.

(56) References Cited

U.S. PATENT DOCUMENTS

| | | | | |
|---|---|---|---|---|
| 5,232,970 | A * | 8/1993 | Solc et al. ..................... | 524/404 |
| 6,223,429 | B1 * | 5/2001 | Kaneda et al. ................ | 29/832 |
| 6,265,782 | B1 * | 7/2001 | Yamamoto et al. .......... | 257/783 |
| 6,514,433 | B1 * | 2/2003 | Takeichi et al. .............. | 252/512 |
| 6,650,821 | B1 * | 11/2003 | Koyano et al. ................ | 385/136 |
| 7,740,944 | B2 * | 6/2010 | Komiya et al. .............. | 428/423.3 |
| 8,022,624 | B2 * | 9/2011 | Ricks et al. .................... | 313/512 |
| 2001/0022404 | A1 * | 9/2001 | Yamamoto et al. .......... | 257/783 |
| 2003/0038362 | A1 * | 2/2003 | Nomura ......................... | 257/706 |
| 2003/0069331 | A1 * | 4/2003 | Teiichi ................... | C08G 59/18 |
| | | | | 523/176 |
| 2003/0176124 | A1 * | 9/2003 | Koike ................... | B32B 17/10018 |
| | | | | 442/16 |
| 2004/0253451 | A1 | 12/2004 | Kawashima et al. | |
| 2005/0024890 | A1 * | 2/2005 | Yamamoto ........... | G02B 6/0038 |
| | | | | 362/555 |
| 2005/0253286 | A1 * | 11/2005 | Yoshikawa et al. .......... | 257/787 |
| 2006/0134409 | A1 * | 6/2006 | Pecorini .................... | C08J 5/18 |
| | | | | 428/355 R |
| 2006/0158111 | A1 | 7/2006 | Hayashi | |
| 2007/0152212 | A1 * | 7/2007 | Cho .................... | H01L 51/5256 |
| | | | | 257/40 |
| 2007/0295390 | A1 * | 12/2007 | Sheats et al. .................. | 136/251 |
| 2008/0000518 | A1 * | 1/2008 | Basol ............................ | 136/247 |
| 2008/0053516 | A1 * | 3/2008 | Hayes ............................ | 136/251 |
| 2008/0284331 | A1 | 11/2008 | Hayashi | |
| 2009/0002620 | A1 * | 1/2009 | Yamashita .......... | C08F 297/026 |
| | | | | 349/137 |
| 2009/0289549 | A1 * | 11/2009 | Lee et al. ...................... | 313/553 |
| 2010/0001634 | A1 * | 1/2010 | Fujita et al. .................. | 313/504 |
| 2010/0112270 | A1 * | 5/2010 | Bulliard et al. ................ | 428/76 |
| 2010/0137775 | A1 * | 6/2010 | Hu ....................... | A61M 1/0088 |
| | | | | 602/54 |
| 2010/0272933 | A1 * | 10/2010 | McCormick et al. ........ | 428/34.1 |
| 2011/0073901 | A1 * | 3/2011 | Fujita et al. .................. | 257/100 |
| 2011/0147954 | A1 * | 6/2011 | Kitamura ...................... | 257/789 |
| 2011/0247874 | A1 * | 10/2011 | Watanabe ................. | C09J 9/02 |
| | | | | 174/267 |
| 2011/0272827 | A1 * | 11/2011 | Blizzard et al. .............. | 257/788 |
| 2011/0318539 | A1 * | 12/2011 | Ozawa et al. ................ | 428/172 |
| 2012/0034415 | A1 * | 2/2012 | Kato et al. .................... | 428/114 |
| 2012/0181914 | A1 * | 7/2012 | Fukuda .................... | B32B 15/08 |
| | | | | 313/46 |
| 2012/0196955 | A9 * | 8/2012 | Zhao et al. .................... | 523/466 |
| 2012/0205822 | A1 * | 8/2012 | Tanaka ......................... | 257/788 |
| 2012/0313508 | A1 * | 12/2012 | Son ........................ | H01L 51/56 |
| | | | | 313/504 |
| 2012/0318344 | A1 * | 12/2012 | Zhao et al. .................... | 136/256 |
| 2013/0075962 | A1 * | 3/2013 | Jigami et al. ................. | 264/496 |
| 2014/0049825 | A1 * | 2/2014 | van Mol et al. .............. | 359/513 |

FOREIGN PATENT DOCUMENTS

| | | |
|---|---|---|
| EP | 2123442 A1 | 11/2009 |
| EP | 2637229 A2 | 9/2013 |
| GB | 2417599 A | 3/2006 |
| JP | 61-260204 | 11/1986 |
| JP | 361260204 A * | 11/1986 |
| JP | 5175364 A | 7/1993 |
| JP | 7153873 A | 6/1995 |
| JP | 08-236271 A | 9/1996 |
| JP | 09-274990 A | 10/1997 |
| JP | 9-274990 A | 10/1997 |
| JP | 2001-68266 A | 3/2001 |
| JP | 2003-062921 A | 3/2003 |
| JP | 2004-018579 | 1/2004 |
| JP | 2004335208 A | 11/2004 |
| JP | 2007-42616 A | 2/2007 |
| JP | 2008-181832 A | 8/2008 |
| JP | 2008-260849 | 10/2008 |
| JP | 2008 260849 A * | 10/2008 |
| JP | 2009123532 A | 6/2009 |
| JP | 2010067355 * | 3/2010 |
| JP | 2010225983 A | 10/2010 |
| KR | 2011-0098689 A | 9/2011 |
| WO | 2011/016408 A1 | 2/2011 |

OTHER PUBLICATIONS

"Resinlab(R) EP1330LV Heat cure Epoxy Polymer System". MatWeb, retrieved Aug. 22, 2015.*
"L-MODU(Low Molecular weight and Low Modulus polypropyl . . . ". Idemitsu, retrieved Jun. 20, 2016.*

* cited by examiner

[FIG. 1]
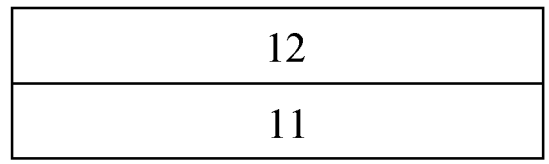
[FIG. 2]
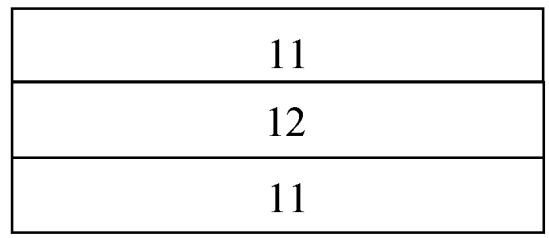
[FIG. 3]
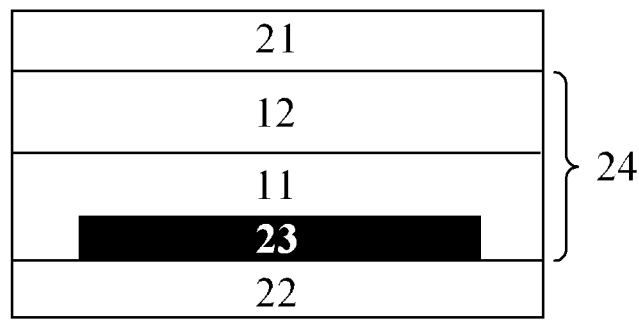
[FIG. 4]
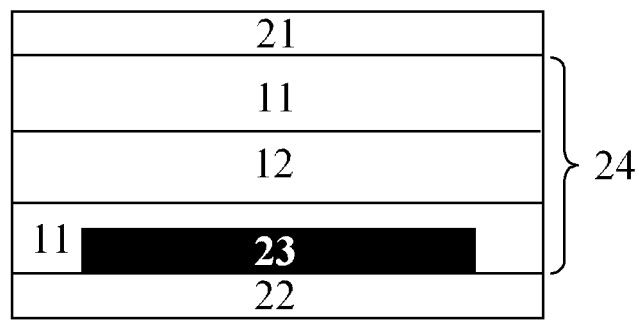

[FIG. 5]
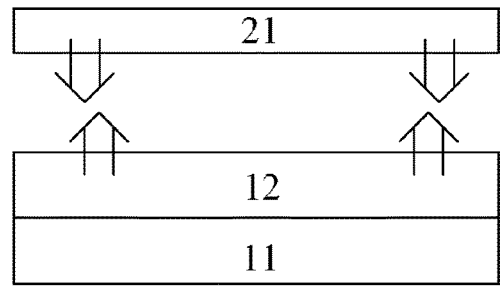
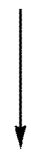
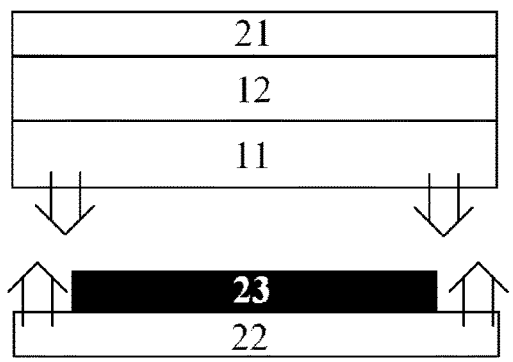
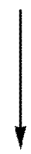
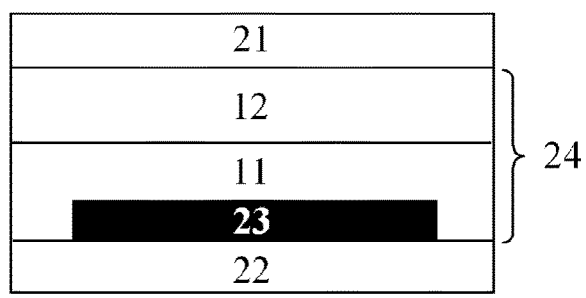

[FIG. 6]
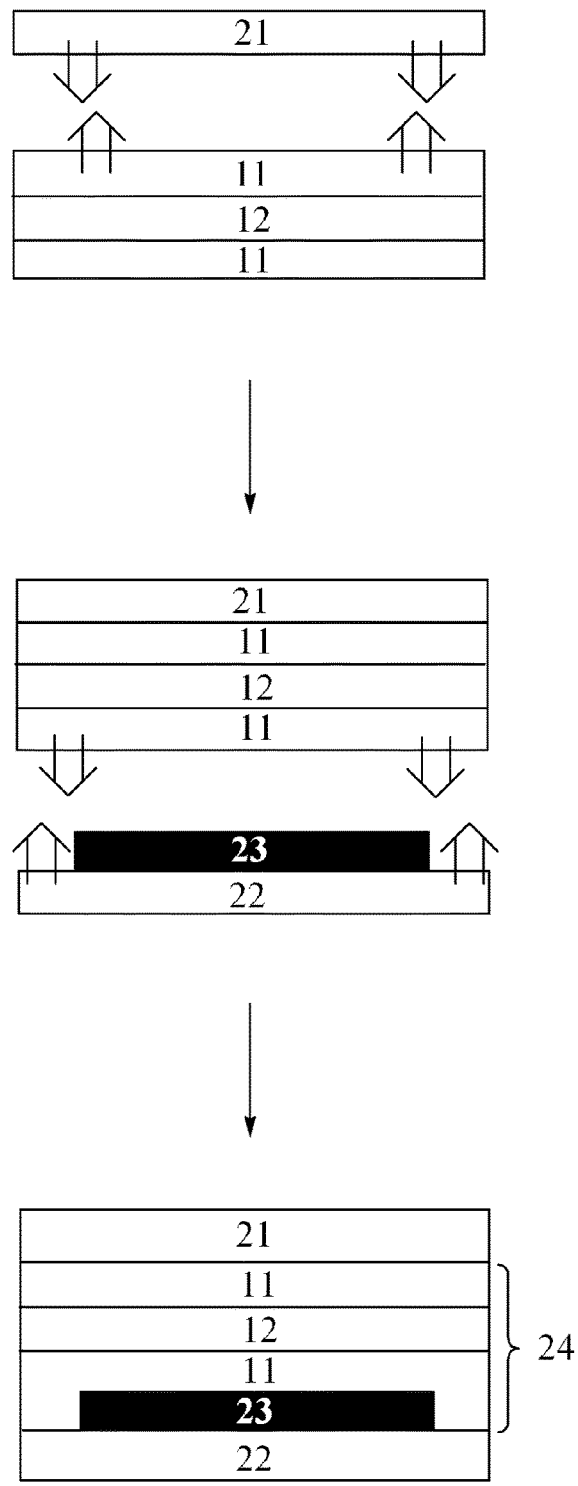

ENCAPSULATION FILM

This application is a Continuation Bypass Application of International Patent Application No. PCT/KR2013/000109, filed on Jan. 7, 2013, and claims the benefit of Korean Patent Application Nos. 10-2012-0002170, filed on Jan. 6, 2012 and 10-2013-0001832, filed on Jan. 7, 2013, in the Korean Intellectual Property Office, all of which are incorporated herein by reference in their entirety.

TECHNICAL FIELD

The present application relates to an encapsulating film, an electronic device and a method of manufacturing the same.

BACKGROUND ART

An encapsulating film may be used to protect a diode or device sensitive to an external factor such as moisture or oxygen. In the diode or device which can be protected by the encapsulating film, for example, an organic electronic device, a solar cell or a secondary battery such as a lithium secondary battery may be included. Particularly, among the diodes or devices, the organic electronic device is vulnerable to an external factor such as moisture or oxygen.

The organic electronic device is a device including a functional organic material. As the organic electronic device or an organic electronic diode included in the organic electronic device, a photovoltaic device, a rectifier, a transmitter or an organic light emitting diode (OLED) may be used.

The organic electronic device is generally vulnerable to an external factor such as moisture. For example, the OLED usually includes a layer of a functional organic material present between a pair of electrodes including a metal or metal oxide, and the layer of an organic material is detached due to an effect of moisture penetrating from an external environment at an interface with the electrode, is increased in resistance value due to oxidation of an electrode by moisture, or is degenerated, thereby causing problems such as a loss of an emissive function or a decrease in luminescence. Accordingly, to protect the OLED from a factor of an external environment such as moisture, an encapsulating structure formed by covering the OLED formed on a substrate with a glass can or metal can equipped with a getter or a moisture absorbent and fixing the resulting OLED with an adhesive is used.

DISCLOSURE

Technical Problem

The present application is directed to providing an encapsulating film, an electronic device and a method of manufacturing the same.

Technical Solution

One aspect of the present application provides an encapsulating film including a first layer and a second layer. The encapsulating film may include at least one of each of the first and second layers, and further include an additional layer in addition to the first and second layers.

The encapsulating film includes first and second layers having different physical properties and/or components. The film may be laminated on a diode without bubbles even when applied to a large-scale device to protect the diode, and effectively protect the diode from an external factor, for example, moisture, after encapsulation. The encapsulating film may have various structures such as a structure in which a second layer 11 is disposed on one surface of a first layer 12 as shown in FIG. 1, or a structure in which second layers 11 are disposed on both surfaces of a first layer 12 as shown in FIG. 2. Here, the structure in which the second layer 11 is disposed on one or both surfaces of the first layer 12 may include a structure in which the second layer 11 is directly attached to the first layer 12, and a structure in which the second layer 11 is indirectly attached to the first layer 12 via another additional layer.

In one example, the encapsulating layer may include a moisture scavenger. The term "moisture scavenger" used herein may refer to a material capable of removing moisture or vapor penetrating the encapsulating film through a chemical reaction with the water or vapor. In this case, the first layer may include a larger amount of moisture scavenger than the second layer. The second layer may include a smaller amount of the moisture scavenger than the first layer, or may not include the moisture scavenger. As will be described later, in the above structure, for example, when the second layer has an encapsulating structure is realized such that the second layer is in contact with a diode, the diode may not be damaged, and an excellent moisture or vapor blocking property may be exhibited. For example, the first layer may include a resin component and a moisture scavenger at 30, 40 or 45 parts by weight or more with respect to 100 parts by weight of the resin component. The upper limit of the ratio of the moisture scavenger in the first layer may be changed according to a desired moisture blocking property, and the first layer may include a moisture scavenger at 250, 230 or 210 parts by weight or less with respect to the resin component, but the present invention is not particularly limited thereto. The second layer may not include the moisture scavenger, or otherwise may include a trace amount of the moisture scavenger. The second layer may include the moisture scavenger, for example, at less than 5 or 3 parts by weight with respect to 100 parts by weight of a solid content of the second layer. Since the second layer may not include a moisture scavenger, the lower limit of the content of the moisture scavenger in the second layer may be 0 parts by weight. Unless particularly defined otherwise, the unit "parts by weight" used herein refers to a weight ratio.

In the encapsulating film, the first layer may have a lower elastic modulus than the second layer. For example, the tensile modulus of the first layer may be lower than that of the second layer. Unless particularly defined otherwise, the tensile modulus used herein is measured at 25° C. In addition, the tensile modulus with respect to a curable component used herein is, unless particularly defined otherwise, a tensile modulus measured after curing.

When the elastic modulus of the first layer is lower than that of the second layer, the encapsulating film is preferable to be applied to a large-scale device, and an effective moisture blocking property can be provided to the film as result of controlling a ratio of a moisture scavenger between the first and second layers. Usually, when the moisture scavenger is reacted with moisture in the film, a volume expands to the extent of the reaction with moisture, thereby generating a stress. Accordingly, if the tensile modulus is not sufficient to reduce an expansion stress generated during the removal of moisture, the film may be detached from an adherent or induce inter-layer detachment in the case of a multilayer structure. For example, when the elastic modulus of the film is controlled to decrease, the detachment due to the stress may be prevented. However, when the elastic modulus is controlled by reducing a glass transition temperature through simply controlling a curing degree, a water vapor transmission rate (WVTR) of the film may be increased. However, when two layers having different elastic moduli are stacked and a moisture scavenger is mainly included in the layer having a lower elastic modulus of the two layers as described above, moisture penetrating through the layer having a relatively smaller amount of the moisture scavenger, that is, the layer having a higher elastic modulus, may be diffused to the layer having a lower elastic modulus, thereby enhancing a moisture blocking property. In addition, other physical properties such as durability of the film may also be satisfied. In one example, the tensile modulus of the first layer may be approximately 0.001 to 100 Mpa, 0.001 to 80 Mpa, 0.001 to 60 Mpa, 0.001 to 40 Mpa, 0.001 to 20 Mpa, 0.001 to 10 Mpa, 0.001 to 5 Mpa, 0.001 to 3 Mpa, 0.001 to 1 Mpa, 0.005 to 100 Mpa, 0.01 to 100 Mpa, 0.05 to 100 Mpa, 0.1 to 100 Mpa, 0.2 to 100 Mpa, 0.3 to 100 Mpa, 0.005 to 80 Mpa, 0.01 to 60 Mpa, 0.05 to 40 Mpa, 0.05 to 20 Mpa, 0.1 to 10 Mpa, 0.1 to 5 Mpa, 0.2 to 3 Mpa or 0.3 to 1 Mpa. In addition, the tensile modulus of the second layer may be approximately 300 to 1000 Mpa, 300 to 900 Mpa, 300 to 800 Mpa, 300 to 700 Mpa, 400 to 1000 Mpa, 500 to 1000 Mpa, 550 to 1000 Mpa, 400 to 900 Mpa, 500 to 800 Mpa or 550 to 700 Mpa. In the above range, the first layer may have a lower elastic modulus than the second layer. For example, a ratio (M1/M2) of the tensile modulus (M1) of the first layer to the tensile modulus (M2) of the second layer may be approximately $1\times10^{-6}$ to 0.5, $1\times10^{-6}$ to 0.4, $1\times10^{-6}$ to 0.3, $1\times10^{-6}$ to 0.2, $10\times10^{-6}$ to 0.5, $100\times10^{-6}$ to 0.5, $200\times10^{-6}$ to 0.5, $300\times10^{-6}$ to 0.5, $400\times10^{-6}$ to 0.5, $500\times10^{-6}$ to 0.5, $10\times10^{-6}$ to 0.4, $100\times10^{-6}$ to 0.4, $200\times10^{-6}$ to 0.3, $300\times10^{-6}$ to 0.3, $400\times10^{-6}$ to 0.2 or $500\times10^{-6}$ to 0.2. In the relationship of the elastic modulus described above, the encapsulating film may also be effectively applied to a large-scale device, and easily controlled in a ratio of the moisture scavenger between the layers, which is preferable to control physical properties of the film.

However, the components of the first and second layers are not limited so that the first and second layers satisfy the relation of the above-mentioned elastic modulus. In one example, the elastic moduli of the first and second layers may be same, or the second layer may have a lower elastic modulus than the first layer in the case of a film capable of being applied to a flexible substrate, since problems such as lifting and/or bubbles may be not occurred in the case of the flexible substrate.

Thicknesses of the first and second layers may be controlled in consideration of the number of layers included in the film or a use of the film. For example, when the film includes one of each of the first and second layers, the thickness of the first layer may be approximately 5 to 100 µm, and the thickness of the second layer may be approximately 2 to 30 µm. In this range, the film having excellent moisture blocking property, workability and durability may be provided.

In one example, the first layer may include a resin component having a contact angle of 80, 85, 90 or 95 degrees or more with respect to deionized water. The contact angle is a contact angle measured after a layer is formed by coating a glass with a solution containing approximately 15 wt % of a solid content prepared by dissolving the resin component in a suitable solvent and drying the coated solution, and deionized water is dropped onto the coating layer at approximately 25° C., and may be an average of contact angles measured by repeating the above process 10 times. As the component whose contact angle is controlled as described above is included in the first layer, the film having excellent moisture blocking property and durability may be provided. The upper limit of the contact angle of the resin component may be, but is not particularly limited to, for example, 150 or 120 degrees or less.

The first layer may also include a resin component having a WVTR of 50 or 45 $g/m^2$·day or less. The WVTR may be measured in a thickness direction of the film which is formed from the resin component to have a thickness of 100 µm at 100° F. and a relative humidity of 100%. As the WVTR of the resin component is controlled as described above, the film having an excellent moisture blocking property may be provided. As the WVTR of the first layer is lower, the film may have a better moisture blocking property, and thus the lower limit thereof is not particularly limited. For example, the lower limit of the WVTR of the first layer may be 0 $g/m^2$·day.

In one example, the resin component included in the first layer may satisfy all of the above ranges of the contact angle and WVTR. As the first layer includes the component having the above ranges of the contact angle and WVTR, the film having excellent moisture blocking property and water repellency may be provided.

As the resin component, any one of known components in the related art providing a first layer satisfying the above-mentioned contact angle and WVTR or the above-mentioned elastic modulus can be used without particular limitation. In addition, if a resin does not satisfy the contact angle and WVTR alone, but satisfies the contact angle and WVTR in combination with another resin, the combined resin may be used as the resin component. The term "resin component" used herein may refer to a base resin forming the first layer. The base resin refers to a resin used to realize main physical properties of the first layer, excluding an optional component such as an additive. In one example, when an additive such as a tackifier is added to the first layer, the base resin may exclude a tackifier.

The component may be a styrene-based resin, a polyolefin-based resin, a thermoplastic elastomer, a polyoxyalkylene-based resin, a polyester-based resin, a polyvinyl chloride-based resin, a polycarbonate-based resin, a polyphenylenesulfide-based resin, a mixture of hydrocarbons, a polyamide-based resin, an acrylate-based resin, an epoxy-based resin, a silicon-based resin, a fluorine-based resin or a mixture thereof.

Here, the styrene-based resin may be, for example, a styrene-ethylene-butadiene-styrene block copolymer (SEBS), a styrene-isoprene-styrene block copolymer (SIS), an acrylonitrile-butadiene-styrene block copolymer (ABS), an acrylonitrile-styrene-acrylate block copolymer (ASA), a styrene-butadiene-styrene block copolymer (SBS), a styrene-based homopolymer or a mixture thereof. The olefin-based resin may be, for example, a high-density polyethylene-based resin, a low-density polyethylene-based resin, a polypropylene-based resin or a mixture thereof. The thermoplastic elastomer may be, for example, an ester-based thermoplastic elastomer, an olefin-based thermoplastic elastomer or a mixture thereof. Among these, the olefin-based thermoplastic elastomer may be a polybutadiene resin or a polyisobutene resin. The polyoxyalkylene-based resin may be, for example, a polyoxymethylene-based resin, a polyoxyethylene-based resin or a mixture thereof. The polyester-based resin may be, for example, a polyethylene terephthalate-based resin, a polybutylene terephthalate-based resin or a mixture thereof. The polyvinylchloride-based resin may be, for example, a polyvinylidene chloride. The mixture of hydrocarbons may be, for example, hexatriacotane or paraffin. The polyamide-based resin may be, for example, nylon. The acrylate-based resin may be, for example, a polybutyl(meth)acrylate. The epoxy-based resin may be, for example, a bisphenol type such as a bisphenol A-, bisphenol F-, or bisphenol S-type epoxy-based resin or a hydrogenated product thereof; a novolac type such as a phenolnovolac- or cresolnovolac-type epoxy-based resin; a nitrogen-containing cyclic type such as a cyclic triglycidylisocyanurate- or hydantoin-type epoxy-based resin; an alicyclic type; an aliphatic type; an aromatic type such as a naphthalene-type epoxy-based resin or a biphenyl-type epoxy-based resin; a glycidyl type such as a glycidylether-type epoxy-based resin, a glycidylamine-type epoxy-based resin, or a glycidylester-type epoxy-based resin; a dicyclo type such as dicyclopentadiene-type epoxy-based resin; an ester type; an etherester type; or a mixture thereof. The silicon-based resin may be, for example, a polydimethylsiloxane. In addition, the fluorine-based resin may be a polytrifluoroethylene resin, a polytetrafluoroethylene resin, a polychlorotrifluoroethylene resin, a polyhexafluoropropylene resin, a polyvinylidene fluoride, a polyvinyl fluoride, a polyethylene propylene fluoride or a mixture thereof.

The resin may be grafted with maleic acid anhydride, copolymerized with another resin listed above or a monomer for preparing a resin, or modified by another compound, which may be a carboxyl-terminal end butadiene-acrylonitrile copolymer.

In addition, the listed resin may include at least one heat-curable functional group or site such as a glycidyl, isocyanate, hydroxyl, carboxyl or amide group, or at least one active energy ray-curable functional group or site such as an epoxide, cyclic ether, sulfide, acetal or lactone group to exhibit an adhesive property after curing.

In one example, the first layer may include a polyisobutene resin. The polyisobutene resin may exhibit low WVTR and surface energy due to hydrophobicity. Particularly, the polyisobutene resin may be, for example, a homopolymer of an isobutylene monomer; or a copolymer prepared by copolymerizing another monomer which can be polymerized with an isobutylene monomer. Here, the monomer which can be polymerized with an isobutylene monomer may be, for example, 1-butene, 2-butene, isoprene or butadiene.

The resin component may be a resin having a weight average molecular weight (Mw) at which it can be molded in a film type. In one example, the range of the weight average molecular weight at which molding in a film type is possible may be approximately 100,000 to 2,000,000, 100,000 to 1,500,000 or 100,000 to 1,000,000. The term "weight average molecular weight (Mw)" used herein refers to a conversion value with respect to a standard polystyrene measured by gel permeation chromatography (GPC).

In addition, as the resin component, one or at least two of the above resins may be used. When at least two resins are used, the resins may be different in kind, weight average molecular weight or both.

Here, the moisture scavenger may be present in a uniformly dispersed state in the resin component. Here, the uniformly dispersed state may refer to a state in which the moisture scavenger is present at the same or substantially the same density in any part of the resin component. The moisture scavenger capable of being used herein may be, for example, a metal oxide, a sulphate or an organic metal oxide. Particularly, the metal oxide may be magnesium oxide, calcium oxide, strontium oxide, barium oxide or aluminum oxide, the sulphate may be magnesium sulfoxide, sodium sulfoxide or nickel sulfoxide, and the organic metal oxide may be aluminum oxide octylate. The moisture scavenger which may be included in the first layer may use one or at least two of the above materials. In one example, when at least two materials are used for the moisture scavenger, calcined dolomite may be used.

Such a moisture scavenger may be controlled in a suitable size according to a use of the film. In one example, an average particle diameter of the moisture scavenger may be controlled to approximately 10 to 15,000 nm. Since a response rate with moisture is not excessively high, the moisture scavenger having a size within the above range may be easily stored, may not damage a diode to be encapsulated, and may effectively remove moisture.

A content of the moisture scavenger may be controlled to, for example, 5 to 250 parts by weight with respect to 100 parts by weight of the resin component as described above.

In addition, in one example, the first layer may further include a dispersing agent such that the moisture scavenger is uniformly dispersed in the resin component. As the dispersing agent capable of being used herein, a non-ionic surfactant having an affinity to a hydrophilic surface of the moisture scavenger and a compatibility with the resin component may be used. In one example, as the non-ionic surfactant, a compound represented by Formula 1 may be used.

R—X [Formula 1]

In Formula 1, R is a saturated or unsaturated hydrocarbon group, and X is a hydroxyl group, a carboxyl group, an amino group or a carbohydrate residue.

In Formula 1, R may be a saturated or unsaturated hydrocarbon group having 4 to 28, 4 to 24, 4 to 20 or 6 to 20 carbon atoms.

In addition, the compound of Formula 1 in which X is a carbohydrate residue may refer to a compound in which one of hydrogen atoms in the carbohydrate is substituted with R. The carbohydrate may be, for example, glucose.

The compound of Formula 1 may be, for example, a fatty acid such as stearic acid, palmitic acid, oleic acid or linoleic acid; a fatty alcohol such as cetyl alcohol, stearyl alcohol, cetostearyl alcohol or oleyl alcohol; or an alkyl glucoside such as octyl glucoside, decyl glucoside or lauryl glucoside.

A content of the dispersing agent may be controlled according to the kind and/or size of a moisture scavenger. Particularly, as the size of the moisture scavenger is decreased, a surface area of the moisture scavenger is increased, and thus a large amount of the dispersing agent is needed to uniformly disperse the moisture scavenger. In one example, when a moisture scavenger having an average particle diameter of approximately 40 nm is used, approximately 5 parts by weight of the dispersing agent may be used based on 100 parts by weight of the moisture scavenger. In one example, when a moisture scavenger having an average particle diameter of approximately 1,000 nm is used, approximately 0.05 parts by weight of the dispersing agent may be used based on 100 parts by weight of the moisture scavenger. Accordingly, in consideration of the above-described kind and/or size of the moisture scavenger, approximately 0.01 to 500 parts by weight of the dispersing agent may be used based on 100 parts by weight of the moisture scavenger. In this range, the moisture scavenger may be uniformly dispersed with no influence on any physical properties including an adhesive strength of the film.

A method of including the moisture scavenger and the dispersing agent in the first layer may be any method used in the related art without particular limitation, and may be a method capable of uniformly dispersing the moisture scavenger in the resin component by controlling a mixing sequence. First, a dispersing solution is prepared by dispersing the dispersing agent in a solvent. Here, the solvent may be selected based on coatability, drying temperature or compatibility with the resin component. In one example, when the polyisobutene resin is used as the resin component, an aromatic solvent such as toluene or xylene may be used as a solvent. The moisture scavenger is added to and mixed with the dispersing solution. Here, as the process of mixing the moisture scavenger with the dispersing solution, a physical dispersion method may further be used to increase dispersity of the moisture scavenger. The physical dispersion method may be, for example, a method using a shaker, sonication or bead milling. A composition for forming the first layer may be obtained by adding the solution in which the moisture scavenger and the dispersing agent are dispersed to a solution including the resin component. The solution in which the moisture scavenger and the dispersing agent are dispersed may be optionally filtered to screen large-sized particles, and then the filtered solution may be added to the solution including the resin component. Through the above process, the first layer in which the moisture scavenger and the dispersing agent are uniformly dispersed in the resin component may be formed. However, the process is not limited to that described above, and will be simply modified by one of ordinary skill in the art.

The first layer may further include a moisture blocker. The term "moisture blocker" used herein may refer to a material having no or low reactivity to moisture penetrating the film, but capable of preventing or interrupting migration of moisture or vapor into the film. As the moisture blocker, one or at least two of clay, talc, needle-shaped silica, planar silica, porous silica, zeolite, titania or zirconia may be used. In addition, the moisture blocker may be surface-treated by an organic modifier to facilitate penetration of an organic material. The organic modifier may be, for example, dimethyl benzyl hydrogenated tallow quaternary ammonium, dimethyl dihydrogenated tallow quaternary ammonium, methyl tallow bis-2-hydroxyethyl quaternary ammonium, dimethyl hydrogenated tallow 2-ethylhexyl quaternary ammonium, dimethyl dehydrogenated tallow quaternary ammonium or a mixture thereof.

A content of the moisture blocker that may be included in the first layer may be suitably controlled in the relationship with a matrix structure of the moisture scavenger and the resin component. In one example, the content of the moisture blocker may be controlled to 0 to 50 parts by weight or 1 to 30 parts by weight with related to 100 parts by weight of the resin component. In this range, the film having excellent moisture blocking property and mechanical properties may be provided.

In one example, the moisture scavenger and the moisture blocker may be uniformly dispersed in the resin component by controlling the mixing sequence of the component for the first layer even when the first layer includes both the moisture scavenger and the moisture blocker.

For example, first, a first dispersing solution may be prepared by adding the moisture blocker to a solvent. Here, the first dispersing solution may be obtained in a dispersing solution in which the moisture blocker is uniformly dispersed through a process such as sonication, bead milling, ball milling, high-speed dispersion or high-pressure dispersion. Separately, as described above, a second dispersing solution in which the moisture scavenger and/or dispersing agent is (are) dispersed is prepared. The prepared first and second dispersing solutions are added to and mixed with the solution including the resin component. During mixing, in consideration of the control in viscosity and coatability of the resin composition, a solvent may further be added. According to the method described above, the first layer in which the moisture scavenger and the blocker are uniformly dispersed may be formed. The method of forming the first layer can be changed with regard to aspects well known to one of ordinary skill in the art without limitation.

The first layer may further include a tackifier. As the tackifier, for example, a hydrogenated petroleum resin obtained by hydrogenating a petroleum resin may be used. The hydrogenated petroleum resin may be a partially or completely hydrogenated resin, or a mixture of such resins. As the tackifier, one having a good compatibility with the resin component and an excellent moisture blocking property may be selected. A particular example of the hydrogenated petroleum resin may be a hydrogenated terpene-based resin, a hydrogenated ester-based resin or a hydrogenated dicyclopentadiene-based resin. The tackifer may have a weight average molecular weight of approximately 200 to 5,000. A content of the tackifier may be suitably controlled when necessary. For example, the tackifier may be included in the first layer at 5 to 100 parts by weight with respect to 100 parts by weight of the resin component.

In addition to the components, various additives may be included in the first layer according to a use of the film and a process of forming the film. For example, in consideration of durability and processibility, a curable material may further be included in the first layer. Here, the curable material may refer to a material having a heat-curable functional group and/or active energy ray-curable functional group which are (is) included, in addition to the resin component. In addition, a content of the curable material included in the first layer may be controlled according to a desired physical property of the film.

In one example, the second layer may be composed as same with the components of the first layer. In addition in another example, the second layer may be a layer including a curable resin composition. In this case, the second layer may be a hot melt-type adhesive layer. The term "hot melt-type adhesive layer" used herein may refer to a layer which may maintain a solid or semi-solid state at room temperature, may be melted when suitable heat is applied, thereby exhibiting a pressure-sensitive adhesive property, and may firmly fix a target material as an adhesive after curing. In addition, the term "curing of the adhesive" used herein may refer to a chemical or physical action or reaction changing the target material to have an adhesive property. In addition, the term "room temperature" may refer to a temperature in a natural state, which is not increased or decreased, for example, approximately 15 to 35° C., 20 to 25° C., 25° C. or 23° C. In addition, here, the maintenance of a solid or semi-solid state at room temperature may refer to the target material having a viscosity of approximately $10^6$ or $10^7$ poises or more at room temperature. Here, the viscosity is measured using an advanced rheometric expansion system (ARES). Here, the upper limit of the viscosity may be, but is not particularly limited to, for example, approximately $10^9$ poises or less.

For example, the second layer may maintain a solid or semi-solid state at room temperature even in a state in which a component included in the second layer such as a curable resin composition is uncured. Accordingly, the second layer may include the curable resin composition in a film type. As a result, excellent handleability may be obtained, physical or chemical damage to a diode during encapsulation may be prevented, and smooth working may progress.

The curable resin composition may be, for example, a curable resin. As the curable resin, a heat-curable, active energy ray-curable or hybrid-curable resin known in the related art may be used. Herein, the term "heat-curable resin" may refer to a resin which may be cured through application of suitable heat or aging, the term "active energy ray-curable resin" may refer to a resin which may be cured by radiation of an active energy ray, and the term "hybrid-curable resin" may refer to a resin which may be cured by simultaneously or sequentially performing curing mechanisms for a heat-curable and active energy ray-curable resins. In addition, the active energy ray may be microwaves, an IR, UV or X ray, a gamma ray, or a particle beam such as an alpha-particle beam, proton beam, neutron beam or electron beam.

The curable resin is a resin exhibiting an adhesive property after curing, and may include at least one heat-curable functional group or site such as a glycidyl, isocyanate, hydroxyl, carboxyl or amide group, or at least one active energy ray-curable functional group or site such as an epoxide, cyclic ether, sulfide, acetal or lactone group. The curable resin may be, but is not limited to, an acrylic resin, polyester resin, isocyanate resin or epoxy resin having the at least one functional group or site described above.

In one example, the curable resin may be an epoxy resin. The epoxy resin may be an aromatic or aliphatic epoxy resin. As the epoxy resin, a heat-curable epoxy resin, or an active energy ray-curable epoxy resin, which is cured by cationic polymerization by radiation of an active energy ray, may be used.

The epoxy resin according to one example may have an epoxy equivalent of 150 to 2,000 g/eq. In the range of the epoxy equivalent, a characteristic such as adhesive performance or a glass transition temperature of a cured product may be maintained in an appropriate range.

In one example, the epoxy resin may be an aromatic epoxy resin. The term "aromatic epoxy resin" used herein may refer to an epoxy resin including an aromatic core such as a phenylene structure or an aromatic group such as a phenyl group in a main or side chain of the resin. When the aromatic epoxy resin is used, the cured product has excellent thermal and chemical stabilities and a low WVTR, and thus reliability of the encapsulating structure for an electronic diode may be enhanced. The aromatic epoxy resin may be, but is not limited to, one or at least two of a biphenyl-type epoxy resin, a naphthalene-type epoxy resin, a dicyclopentadiene-type epoxy resin, a dicyclopentadiene-modified phenol-type epoxy resin, a cresol-based epoxy resin, a bisphenol-based epoxy resin, a xyloc-based epoxy resin, a multifunctional epoxy resin, a phenol novolac epoxy resin, a triphenolmethane-type epoxy resin and an alkyl-modified triphenolmethane epoxy resin. In one example, the epoxy resin may be a silane-modified epoxy resin. The silane-modified epoxy resin may be, for example, a reaction product between at least one of the epoxy resins described above and a silane compound. Here, the silane compound may be, for example, a compound represented by Formula 2.

  [Formula 2]

In Formula 2, D is a vinyl group, an epoxy group, an amino group, an acryl group, a methacryl group, a mercapto group, an alkoxy group or an isocyanate group, or an alkyl group substituted with at least one of the functional groups, Q is hydrogen, an alkyl group, a halogen, an alkoxy group, an aryl group, an aryloxy group, an acyloxy group, an alkylthio group or an alkyleneoxythio group, and n is a number between 1 and 3.

In the compound of Formula 2, the functional group D may form a silane-modified epoxy resin by a reaction with a functional group included in the epoxy resin.

For example, when the functional group is an amino group, the amino group may form a bond "—CH(OH)—CH$_2$—NH—" by a reaction with an epoxy group of the epoxy resin, and thus the silane compound may be introduced into the epoxy group.

In addition, when the functional group D is an isocyanate or alkoxy group, a silane compound may be introduced by a reaction with an epoxy resin including a hydroxyl (OH) group, for example, a bisphenol-type epoxy resin such as a bisphenol F-type epoxy resin, a bisphenol F-type novolac epoxy resin, a bisphenol A-type epoxy resin or a bisphenol A-type novolac epoxy resin.

In Formula 2, the alkyl group may be an alkyl group having 1 to 20, 1 to 16, 1 to 12, 1 to 8 or 1 to 4 carbon atoms. The alkyl group may be a linear, branched or cyclic alkyl group.

In Formula 2, a halogen atom may be fluorine (F), chlorine (Cl), bromine (Br) or iodine (I).

In addition, in Formula 2, the alkoxy group may be an alkoxy group having 1 to 20, 1 to 12, 1 to 8 or 1 to 4 carbon atoms. The alkoxy group may be a linear, branched or cyclic alkoxy group.

In addition, in Formula 2, the aryl group or aryl group included in the aryloxy group may be an aryl group or an aralkyl group. For example, the aryl group may refer to a monovalent residue derived from a compound including at least one benzene ring or a structure in which at least two benzene rings are linked or condensed or a derivative thereof. The aryl group may be, for example, an aryl group having 6 to 25, 6 to 21, 6 to 18 or 6 to 12 carbon atoms. As the aryl group, for example, a phenyl group, a dichlorophenyl group, a chlorophenyl group, a phenylethyl group, a phenylpropyl group, a benzyl group, a tolyl group, a xylyl group or a naphthyl group may be used.

In addition, in Formula 2, the acyloxy group may be an acyloxy group having 1 to 20, 1 to 16 or 1 to 12 carbon atoms.

In addition, in Formula 2, the alkylthio group may be an alkylthio group having 1 to 20, 1 to 16, 1 to 12, 1 to 8 or 1 to 4 carbon atoms, the alkyleneoxythio group may be an alkyleneoxythio group having 1 to 20, 1 to 16, 1 to 12, 1 to 8 or 1 to 4 carbon atoms.

The alkyl, alkoxy, aryl, acyloxy, alkylthio or alkyleneoxythio group may be optionally substituted with at least one substituent. The substituent may be, but is not limited to, a hydroxyl group, an epoxy group, an alkyl group, an alkenyl group, an alkynyl group, an alkoxy group, an acyl group, a thiol group, an acryloyl group, a methacryloyl group, an aryl group or an isocyanate group.

In Formula 2, the functional group D may be, for example, an alkoxy group, an amino group or an isocyanate group among these.

In addition, in Formula 2, at least one, two or three of the functional groups Q may be, for example, a halogen atom, an alkoxy group, an aryloxy group, an acyloxy group, an alkylthio group or an alkyleneoxythio group, or an alkoxy group.

As the silane-modified epoxy group, for example, an epoxy resin into which a silane compound is introduced at approximately 0.1 to 10 parts by weight, 0.1 to 9 parts by weight, 0.1 to 8 parts by weight, 0.1 to 7 parts by weight, 0.1 to 6 parts by weight, 0.1 to 5 parts by weight, 0.1 to 4 parts by weight, 0.1 to 3 parts by weight, 0.3 to 2 parts by weight or 0.5 to 2 parts by weight with respect to 100 parts by weight of the epoxy resin. In one example, the epoxy resin to which the silane compound is introduced may be an aromatic epoxy resin. The aromatic epoxy resin may be, for example, a bisphenol-type epoxy resin such as a bisphenol F-type epoxy resin, a bisphenol F-type novolac epoxy resin, a bisphenol A-type epoxy resin or a bisphenol A-type novolac epoxy resin.

Due to the epoxy resin which is modified by a silane to include a silyl group in its structure, the encapsulating layer of an electronic device may have an excellent adhesive property to a substrate, etc., and excellent moisture blocking property, durability and reliability.

The second layer may further include a curing agent which may form a crosslinking structure by a reaction with a curable resin or an initiator which may initiate a curing reaction of the resin depending on the kind of the curable resin.

A suitable kind of the curing agent may be selected and used according to the kind of the curable resin or a functional group included in the resin.

In one example, when the curable resin is an epoxy resin, as a curing agent, a curing agent for the epoxy resin known in the related art may be used, and may be, but is not limited to, one or at least two of an amine curing agent, an imidazole curing agent, a phenol curing agent, a phosphorus curing agent or an acid anhydride curing agent.

In one example, as the curing agent, an imidazole compound which is solid at room temperature and has a melting point or decomposition temperature of 80° C. or more may be used. Such a compound may be, but is not limited to, 2-methyl imidazole, 2-heptadecyl imidazole, 2-phenyl imidazole, 2-phenyl-4-methyl imidazole or 1-cyanoethyl-2-phenyl imidazole.

A content of the curing agent may be selected according to a composition of the composition, for example, a kind or ratio of the curable resin. For example, the curing agent may be included at 1 to 20, 1 to 10 or 1 to 5 parts by weight with respect to 100 parts by weight of the curable resin. However, the weight ratio may be changed according to the kind and ratio of a curable resin or a functional group of the resin, or a crosslinking density to be realized.

When the curable resin is an epoxy resin which may be cured by radiation of an active energy ray, as an initiator, for example, a cationic photoinitiator may be used.

The cationic photoinitiator may be an onium salt or organometallic salt-based ionized cationic initiator or an organic silane or latent sulfonic acid-based non-ionized cationic photoinitiator. The onium salt-based initiator may be a diaryliodonium salt, a triarylsulfonium salt or an aryldiazonium salt, the organic metal salt-based initiator may be an iron arene, the organic silane-based initiator may be an o-nitrobenzyl triaryl silyl ether, a triaryl silyl peroxide or an acyl silane, and the latent sulfonic acid-based initiator may be α-sulfonyloxy ketone or α-hydroxymethylbenzoin sulfonate, but the present invention is not limited thereto.

In one example, the cationic initiator may be an ionized cationic photoinitiator.

A content of the initiator may be changed according to the kind and ratio of a curable resin or a functional group of the resin, or a crosslinking density to be realized like the curing agent. For example, the initiator may be blended at a content of 0.01 to 10 parts by weight or 0.1 to 3 parts by weight with respect to 100 parts by weight of the curable resin. When the content of the curing agent is excessively small, curing may not be sufficiently performed, and when the content of the curing agent is excessively high, a content of an ionic material is increased after curing, and thus the durability of the adhesive is degraded or a conjugate acid is formed due to the characteristic of the initiator, which is inappropriate for optical durability. In addition, depending on a base, corrosion may occur, and therefore a suitable content range may be selected.

The second layer may further include a binder resin. The binder resin may serve to improve moldability when molded in a film or sheet type.

The kind of a binder resin is not particularly limited if a resin has a compatibility with a different resin such as a curable resin. The binder resin may be a phenoxy resin, an acrylate resin or a high molecular weight epoxy resin. Here, the high molecular weight epoxy resin may refer to a resin having a weight average molecular weight of approximately 2,000 to 70,000 or 4,000 or 6,000. The high molecular weight epoxy resin may be a solid bisphenol A-type epoxy resin or a solid bisphenol F-type epoxy resin. As the binder resin, a rubber component such as a high-polarity functional group-containing rubber or a high-polarity functional group-containing reactive rubber may be used. In one example, the binder resin may be a phenoxy resin.

When the binder resin is included, its ratio may be controlled according to a desired physical property, but is not particularly limited. For example, the binder resin may be included at a content of approximately 200, 150 or 100 parts by weight with respect to 100 parts by weight of a curable adhesive component. When the content of the binder resin is 200 parts by weight or less, a compatibility with each component of the second layer may be effectively maintained, and the binder resin may serve as an adhesive layer.

The second layer may further include a moisture blocker. When the moisture scavenger is in contact with a diode including an organic material, it may damage the diode by a chemical reaction with moisture. Accordingly, the second layer may or may not include a trace amount of the moisture scavenger. When the second layer includes a trace amount of the moisture scavenger, a content of the moisture scavenger may be as described above. However, the moisture blocker makes a migration path for moisture longer to block moisture, and since it has a smaller reactivity than the moisture scavenger, it has a lower chance of damaging the diode. A content of the moisture blocker which may be included in the second layer may be, for example, approximately 0.01 to 50 parts by weight or 1 to 30 parts by weight based on 100 parts by weight of the curable resin. A particular kind of the moisture blocker and a method of dispersing the moisture blocker in the curable resin may be understood with reference to the moisture blocker included in the first layer and the method of including the moisture blocker.

The second layer may further include an additive such as a plasticizing agent, a UV stabilizer and/or an antioxidant without affecting a desired effect.

The film may further include a base. The base may be disposed on one or both surfaces of the film. The base may be, for example, a release-treated base, or any one used in the related art without limitation.

The encapsulating film may encapsulate and protect various targets. Particularly, the film may be effective in protecting a target including a diode sensitive to an external component, for example, moisture or vapor. As an example of the target to which the encapsulating film may be applied, an organic electronic device such as a photovoltaic device, a rectifier, a transmitter or an OLED, a solar cell or a secondary battery may be used, but the present invention is not limited thereto.

Another aspect of the present invention provides an electronic device including an upper substrate, a bottom substrate, and an encapsulating layer including a film encapsulating a diode between the upper substrate and the bottom substrate. Here, the diode may refer to any one part of the electronic device. As a representative example of the diode which may be protected by the film, an organic electronic diode such as an OLED may be used, but the present invention is not limited thereto.

In one example, the film may be the encapsulating film having first and second layers described above. The film may be, for example, uncured. The encapsulating layer including the above film may be a layer formed by curing the film.

In the electronic device, the upper substrate may be disposed to face the bottom substrate. In addition, the diode may be formed on one surface of the bottom substrate, which may face the upper substrate. The film may be disposed between the upper and bottom substrates, and the second layer of the film may be disposed to be in contact with the bottom substrate having the diode. In such a structure, the film may substantially cover an entire surface of the diode. In one example, as shown in FIG. 3, the film may include a first layer 12 and a second layer 11, and the second layer 11 may be disposed to be in contact with a diode 23 and a bottom substrate 22. In addition, in another example, as shown in FIG. 4, the film may include a second layer 11, a first layer 12 and another second layer 11, and any one of the second layers 11 may be disposed to be in contact with a diode 23 and a bottom substrate 22. As described above, since the second layer includes a trace amount of or no moisture scavenger capable of damaging the diode, it does not influence a function even when the second layer is in contact with the diode. In addition, as described above, the second layer has a step difference compensating property, and thus may be attached to a surface having a height difference such as the bottom substrate having the diode 23 without lifting and/or bubbles. As a result, the electronic device having an excellent interface adhesive strength between the encapsulating layer and the diode or bottom substrate may be provided.

In the encapsulating layer formed by curing the film, the second layer may have a glass transition temperature of 0, 50, 70, 85 or 100° C. or more. Since the first layer may include large amounts of the moisture scavenger, ions generated by a reaction between the moisture scavenger and moisture may migrate to the second layer. However, the second layer may be in contact with the diode, and thus the ions migrating from the first layer to the second layer may influence performance of the diode. For this reason, the second layer may be sufficiently cured, thereby preventing the migration of the ions from the first layer to the second layer, and deterioration of the performance of the diode. That is, the second layer may have the above-described effects by preventing the migration of the ions having a glass transition temperature within in the above range from the first layer to the second layer.

In one example, the electronic device may be an organic electronic device. The encapsulating layer may exhibit excellent moisture blocking property and optical properties in the organic electronic device, and effectively fix and support the upper substrate and the bottom substrate. In addition, the encapsulating layer may have excellent transparency since the moisture scavenger is prepared in a nano size and uniformly dispersed in the resin, and thus become stable regardless of a shape of the organic electronic device such as a top emission or bottom emission type.

The organic electronic device may be provided in a conventional configuration known in the related art except that the encapsulating layer is formed of the above film. For example, as the bottom or upper substrate, a glass, metal or polymer film, which is conventionally used in the related art, may be used. In addition, the OLED may include, for example, a pair of electrodes and a layer of an organic material formed between the pair of electrodes. Here, any one of the pair of electrodes may be a transparent electrode. In addition, the layer of an organic material may include, for example, a hole transport layer, an emitting layer and an electron transport layer.

Still another aspect of the present invention provides a method of manufacturing an electronic device including laminating the above-described film on a substrate on which a diode is formed such that a second layer of the film is in contact with the diode.

In one example, the method of manufacturing an electronic device may be a method of manufacturing the above-described electronic device.

In the above, to stack the film to be in contact with the diode, the film may be applied to cover an entire surface of the diode.

In addition, the laminating of the second layer of the film to be in contact with the diode may include disposing the second layer of the film to be in contact with the diode, and pressing the diode while the second layer is heated to provide flowability. In one example, the second layer may be solid or semi-solid at room temperature, and may be heated to maintain a viscosity of $10^3$ to $10^5$ Pa·s at 65° C. and 1 Hz when the second layer is in contact with the diode. When the second layer is the above-described hot melt-type adhesive layer, it may be attached to a surface having a height difference such as the substrate on which the diode is formed without lifting and/or bubbles. Accordingly, even a large-scale electronic device may be provided without degradation in performance due to bubbles.

Here, when the second layer includes a heat-curable resin, the heating may be controlled to a temperature within approximately 40 to 100° C. and a time within 1 to 20 minutes since a cohesive strength and an adhesive strength of the encapsulating layer may be decreased due to over-curing.

In addition, the pressing may be performed using a vacuum press to prevent bubbles from being generated between the diode and the second layer.

In addition, the method may include curing the second layer after the second layer is stacked to be in contact with the diode. The curing process may be performed in a suitable heating chamber or UV chamber depending on, for example, a method of curing a curable resin. Heating conditions or conditions for radiating an active energy ray may be suitably selected in consideration of stability of the electronic diode and curability of a curable resin composition.

In one example, the curing may be performed such that the second layer has a glass transition temperature of 0° C., 50° C., 70° C., 85° C. or 100° C. or more. When the curing is performed such that the second layer has the above range of a glass transition temperature, it can prevent the migration of ions from the first layer to the second layer, and thus the above-described effects can be exhibited.

In one example, the film may be pre-transferred to the upper substrate of the electronic device before laminating. As shown in FIG. 5, when the film includes a first layer 12 and a second layer 11, the first layer 12 of the film may be transferred to an upper substrate 21. In one example, when the first layer 12 has a pressure-sensitive adhesive property, it may be attached to the upper substrate 21 by a predetermined pressure. Accordingly, the transfer of the first layer may be performed by roll lamination after the first layer is in contact with the upper substrate 21. In addition, in another example, when the first layer 12 has an adhesive property, the transfer of the first layer 12 may be performed as described in the method of laminating the second layer, on a diode, and curing of the first layer 12 may be included. Afterward, as described above, the second layer 11 of the film may be stacked on the diode 23.

In addition, as shown in FIG. 6, when the film includes a second layer 11, a first layer 12 and a second layer 11, the second layer 11 of the film may be transferred to an upper substrate 21. The transfer of the second layer 11 may be performed as described in the method of laminating the second layer on the diode, and include curing the second layer.

The method described above is an example of the method of manufacturing an electronic device, but the present invention is not limited thereto. The process of manufacturing the device may be performed as described above, but a sequence or conditions of the process may be changed.

Advantageous Effects

In the present application, an encapsulating film having excellent moisture blocking property, handleability, workability and durability and a structure including a diode encapsulated with the encapsulating film may be provided.

DESCRIPTION OF DRAWINGS

FIG. 1 is a schematic diagram of a film according to an exemplary embodiment.

FIG. 2 is a schematic diagram of a film according to another exemplary embodiment.

FIG. 3 is a schematic diagram of an organic electronic device according to an exemplary embodiment.

FIG. 4 is a schematic diagram of an organic electronic device according to another exemplary embodiment.

FIG. 5 is a schematic diagram illustrating a method of manufacturing an organic electronic device according to an exemplary embodiment.

FIG. 6 is a schematic diagram illustrating a method of manufacturing an organic electronic device according to another exemplary embodiment.

MODE FOR INVENTION

Hereinafter, a film will be described in further detail with reference to Examples and Comparative Examples, but the scope of the film is not limited to the following Examples.

Hereinafter, physical properties shown in Examples and Comparative Examples are evaluated by the following methods.

1. Measurement of Tensile Modulus

A resin composition was prepared by dissolving a first or second layer prepared in Example or Comparative Example in a solvent. The resin composition was coated on a base film (releasing polyester film, RS-21G, SKC) having a thickness of 38 µm. Subsequently, the coated composition was dried at 110° C. for 10 minutes, and thereby a film-type layer having a thickness of 40 µm was prepared. The prepared coating layer was designed to be coated in a length direction, and then cut in a size of 50 mm×10 mm (length×width), thereby preparing a specimen. Both terminal ends of the specimen were taped to leave 25 mm in a length direction. Subsequently, while the taped part was extended at 25° C. at a rate of 18 mm/min, a tensile modulus was measured.

2. Evaluation of Moisture Blocking Property

Calcium (Ca) was deposited on a glass substrate having a size of 12 mm×12 mm (length×width) to have a size of 10 mm×10 mm (length×width). Separately, a film formed in Example or Comparative Example was cut to a size of 12 mm×12 mm (length×width). Subsequently, the first layer or one surface of the film was transferred to a cover glass. Afterward, an opposite surface to that of the film on which the cover glass was disposed was laminated on the calcium of the glass substrate, and thermally pressed using a vacuum press at 80° C. for 2 minutes, and cured at 100° C. for 3 hours, thereby forming an encapsulating layer. Thus, a specimen was manufactured. Then, while the specimen was maintained in a constant temperature and constant humidity chamber at 85° C. and a relative humidity of 85% for approximately 500 hours, a length of the calcium-deposited part which was oxidized and made transparent was measured. Since calcium had a total length in one direction of 10 mm, the length of the oxidized part of the calcium from one terminal end became 5 mm, which meant that all of the calcium was oxidized.

3. Evaluation of Durability and Reliability

A film formed in Example or Comparative Example was laminated between soda lime glass substrates, thermally pressed using a vacuum press at 80° C. for 2 minutes, and curing the substrates at 100° C. for 3 hours, thereby forming an encapsulating layer. As a result, a specimen was prepared. Afterward, while the specimen was maintained in a constant temperature and constant humidity chamber at 85° C. and a relative humidity of 85% for approximately 500 hours, it was observed whether or not lifting occurred at an interface between the glass substrate and the encapsulating layer.

4. Evaluation of Applicability of Panel

A film formed in Example or Comparative Example was cut to a size of 90 mm×90 mm (length×width), and a first layer or one surface of the film was transferred to a cover glass. Then, an opposite surface to that of the film on which the cover glass was disposed was thermally pressed on a glass substrate having a size of 100 mm×100 mm (length× width) using a vacuum press at 80° C. for 2 minutes, and cured at 100° C. for 3 hours, thereby preparing a specimen. It was observed whether or not bubbles were generated in the specimen.

Example 1

(1) Preparation of First Layer Solution

A moisture scavenger solution was prepared by adding 100 parts by weight of calcined dolomite as a moisture scavenger and 0.5 parts by weight of stearic acid as a dispersing agent to a solution to have a solid content of 50 wt %, and the solution was milled by ball milling for 24 hours. In addition, separately, 70 parts by weight of a polyisobutene resin (Product Name: B100, Manufacturer: BASF) having a weight average molecular weight of 1,100,000 was added to a reaction vessel as a resin component for the first layer, and 30 parts by weight of a hydrogenated dicyclopentadiene-based resin (Product Name: SU-90, Manufacturer: Kolon) was added as a tackifier and then diluted with toluene to have a solid content of approximately 20 wt %. Afterward, an inside of the reaction vessel was substituted with nitrogen, and the prepared solution was homogenized. The previously-prepared moisture scavenger solution was added to the homogenized solution to have a content of calcined dolomite of 50 parts by weight with respect to 100 parts by weight of the resin component. Thus, a first layer solution was prepared.

(2) Preparation of Second Layer Solution

A second layer solution was prepared by adding 100 parts by weight of a silane-modified epoxy resin (KSR-177, Kukdo Chemical), 100 parts by weight of a bisphenol A-type epoxy resin (YD-011, Kukdo Chemical) and 80 parts by weight of a phenoxy resin (YP-50, Tohto Kasei) to a reaction vessel at room temperature, diluting the resulting mixture with methylethylketone, substituting an inside of the reaction vessel with nitrogen, homogenizing the prepared solution, adding 4 parts by weight of an imidazole (Shikoku Chemical) as a curing agent to the homogenized solution, and stirring the resulting solution at a high rate for 1 hour.

(3) Formation of Film

A first layer was formed to a thickness of 40 μm by coating the solution of a first layer previously prepared on a release surface of releasing PET and drying the coated solution at 110° C. for 10 minutes.

A second layer was formed to a thickness of 15 μm by coating the solution of a second layer previously prepared on a release surface of releasing PET and drying the coated solution at 130° C. for 3 minutes.

A multilayer film was formed by laminating the first and second layers.

Example 2

A first layer solution, a second layer solution and a film were prepared as described in Example 1, except that a moisture scavenger solution was added to have a content of calcined dolomite of 100 parts by weight with respect to 100 parts by weight of the resin component.

Example 3

A first layer solution, a second layer solution and a film were prepared as described in Example 1, except that a moisture scavenger solution was added to have a content of calcined dolomite of 200 parts by weight with respect to 100 parts by weight of the resin component.

Example 4

(1) Preparation of First Layer Solution

A first layer solution was prepared by adding 100 parts by weight of a carboxyl-terminal end butadiene-acrylonitrile (CTBN)-modified epoxy resin (Product Name: KR-207, Manufacturer: Kukdo Chemical) and 100 parts by weight of a phenoxy resin (YP-50, Tohto Kasei) as resin components to a reaction vessel at room temperature, diluting the resulting mixture with toluene to have a solid content of approximately 20 wt %, homogenizing the prepared solution, putting 4 parts by weight of an imidazole (Shikoku Chemical) into the homogenized solution as a curing agent, stirring the resulting solution at a high rate for 1 hour, and mixing the same moisture scavenger solution as prepared in Example 1 with the resulting solution to have a content of calcined dolomite of 70 parts by weight with respect to 100 parts by weight of the resin component.

(2) Preparation of Second Layer Solution

A second layer solution was prepared as described in Example 1.

(3) Formation of Film

A film was formed as described in Example 1, except that the solution prepared in Example 4 was used as a first layer solution.

Example 5

A first layer solution, a second layer solution and a film were prepared as described in Example 4, except that 70 parts by weight of a dicyclopentadiene-based epoxy resin (DCPD) and 30 parts by weight of a maleic acid anhydride-modified isobutene copolymer (Product Name: Glissopal, Manufacturer: BASF) were used as resin components for the first layer instead of 100 parts by weight of a CTBN-modified epoxy resin.

Example 6

A first layer solution and a film were prepared as described in Example 1, except that a solution to which the moisture scavenger solution was not added of the first layer solution in Example 1 was used as a second layer solution.

Comparative Example 1

A second layer solution and a film were prepared as described in Example 1, except that the second layer solution in Example 1 was used as a first layer solution. However, the first layer solution prepared by adding the same moisture scavenger solution as prepared in Example 1 to the solution to have a content of calcined dolomite of 10 parts by weight with respect to 100 parts by weight of an epoxy resin was used.

Comparative Example 2

A first layer solution, a second layer solution and a film were prepared as described in Comparative Example 1, except that a moisture scavenger solution was added to have a content of calcined dolomite of 50 parts by weight with respect to 100 parts by weight of an epoxy resin.

Comparative Example 3

A first layer solution, a second layer solution and a film were prepared as described in Comparative Example 1, except that a moisture scavenger solution was added to have a content of calcined dolomite of 70 parts by weight with respect to 100 parts by weight of an epoxy resin.

Comparative Example 4

A first layer solution, a second layer solution and a film were prepared as described in Comparative Example 1, except that a moisture scavenger solution was added to have a content of calcined dolomite of 100 parts by weight with respect to 100 parts by weight of an epoxy resin.

Comparative Example 5

(1) Preparation of First Layer Solution

A first layer solution was prepared as described in Comparative Example 4.

(2) Preparation of Second Layer Solution

A second layer solution was prepared by adding 70 parts by weight of a polyisobutene resin and 30 parts by weight of a hydrogenated dicyclopentadiene-based resin to a reaction vessel at room temperature, diluting the resulting mixture with toluene to have a solid content of 20 wt %, substituting an inside of the reaction vessel with nitrogen, and homogenizing the prepared solution.

(3) Formation of Film

A film was formed as described in Comparative Example 3, except that the second layer solution prepared in Comparative Example 5 was used as a second layer solution.

Comparative Example 6

A first layer solution, a second layer solution and a film were prepared as described in Example 1, except that the moisture scavenger solution was added to have a content of calcined dolomite of 10 parts by weight with respect to 100 parts by weight of the resin component.

TABLE 1

|  |  | M1[a] | M2[b] | M1/M2 | Moisture Blocking Property[c] | Durability and Reliability | Possibility to Apply Panel |
|---|---|---|---|---|---|---|---|
| EXAMPLE | 1 | 0.68 | 580 | 0.0012 | 2 | Good | No Bubbles |
|  | 2 | 0.68 | 580 | 0.0012 | 1.6 | Good | No Bubbles |
|  | 3 | 0.68 | 580 | 0.0012 | 1.1 | Good | No Bubbles |
|  | 4 | 1 | 580 | 0.0017 | 4.3 | Good | No Bubbles |
|  | 5 | 98 | 580 | 0.1690 | 4.1 | Good | No Bubbles |
|  | 6 | 0.68 | 0.68 | 1 | 1.8 | Good | Bubbles |
| C. EXAMPLE | 1 | 580 | 580 | 1 | More than 5 | Destroyed | No Bubbles |
|  | 2 | 580 | 580 | 1 | More than 5 | Destroyed | No Bubbles |
|  | 3 | 580 | 580 | 1 | More than 5 | Destroyed | No Bubbles |
|  | 4 | 580 | 580 | 1 | More than 5 | Destroyed | No Bubbles |
|  | 5 | 580 | 0.68 | 853 | More than 5 | Destroyed | Bubbles |
|  | 6 | 0.68 | 580 | 0.0012 | More than 5 | Good | No Bubbles |

[a]Tensile Modulus (Unit: MPa) of First Layer
[b]Tensile Modulus (Unit: MPa) of Second Layer
[c]Length of calcium oxidized in one direction from one surface (Unit: mm)
*C. EXAMPLE: Comparative Example

The invention claimed is:

1. An encapsulating film for an organic electronic device, comprising:
a first layer including a resin component wherein the resin component is a material selected from the group consisting of a styrene-based resin, a polyolefin-based resin, a thermoplastic elastomer, a polyoxyalkylene-based resin, a polyester-based resin, a polyvinyl chloride-based resin, a polycarbonate-based resin, a polyphenylenesulfide-based resin, a mixture of hydrocarbons, a polyamide-based resin, an acrylate-based resin, a silicon-based resin, a fluorine-based resin and a mixture thereof, and a moisture scavenger of 30 parts by weight to 250 parts by weight with respect to 100 parts by weight of the resin component, and having a tensile modulus of 0.001 to 100 MPa measured at 25° C. after being cured; and
a second layer including a curable resin composition and a moisture scavenger at 0 parts by weight or more and less than 5 parts by weight with respect to 100 parts by weight of a solid content of the second layer,
wherein the encapsulating film is arranged such that when placed on the organic electronic diode the second layer is in physical contact with the organic electronic diode, and the first layer is not in physical contact with the organic electronic diode,
wherein the tensile modulus of the first layer measured at 25° C. after being cured is lower than the tensile modulus of the second layer measured at 25° C. after being cured, and
wherein the first layer is a pressure-sensitive adhesive layer or an adhesive layer.

2. The film of claim 1, wherein the second layer is disposed on one or both surfaces of the first layer.

3. The film of claim 1, wherein the second layer is solid or semi-solid at room temperature.

4. The film of claim 3, wherein the second layer is in a non-cured state.

5. The film of claim 1, wherein the second layer comprises the curable resin composition in a film type.

6. An electronic device comprising:
an upper substrate;
a bottom substrate; and
an encapsulating layer including the film of claim 1 encapsulating a diode between the upper and bottom substrates.

7. The electronic device of claim 6, wherein the diode is formed on a surface of the bottom substrate facing the upper substrate, and the second layer of the film is in contact with the bottom substrate.

8. A method of manufacturing an electronic device, comprising: laminating the film of claim 1 on a substrate on which a diode is formed such that the second layer of the film is in contact with the diode.

9. The film of claim 1, wherein the moisture scavenger is a metal oxide, a sulfate or inorganic metal oxide.

10. The film of claim 1, wherein the moisture scavenger is magnesium oxide, calcium oxide, strontium oxide, barium oxide, aluminum oxide, magnesium sulfoxide, sodium sulfoxide, nickel sulfoxide, or aluminum oxide octylate.

11. The film of claim 1, wherein the first and second layers are in direct mutual contact.

* * * * *